United States Patent [19]

Tsang

[11] Patent Number: 4,831,628
[45] Date of Patent: May 16, 1989

[54] DEVICES FABRICATED USING METHOD OF SELECTIVE AREA EPITAXIAL GROWTH USING ION BEAMS

[75] Inventor: Won-Tien Tsang, New Providence, N.J.

[73] Assignee: American Telephone and Telegraph Company, ATT&T Bell Laboratories, Murray Hill, N.J.

[21] Appl. No.: 928,957

[22] Filed: Nov. 10, 1986

Related U.S. Application Data

[60] Division of Ser. No. 817,785, Jan. 8, 1986, Pat. No. 4,622,093, which is a continuation of Ser. No. 517,755, Jul. 27, 1983, abandoned.

[51] Int. Cl.[4] .............................................. H01S 3/19
[52] U.S. Cl. .................................. 372/46; 350/96.12; 372/44; 372/50; 372/97; 156/610
[58] Field of Search ...................... 372/44, 45, 46, 50, 372/97; 357/17, 16; 350/96.12; 156/610; 148/175

[56] References Cited

U.S. PATENT DOCUMENTS

| 4,255,717 | 3/1981 | Scifres et al. | 372/50 |
| 4,578,791 | 3/1986 | Chen | 372/50 |

FOREIGN PATENT DOCUMENTS

| 0138696 | 12/1978 | Japan | 372/97 |
| 0027778 | 2/1980 | Japan | 372/30 I |

OTHER PUBLICATIONS

Saruwatan et al., "Nd-Glass Laser with Three-Dimensional Optical Waveguide", Applied Phys. Letters, vol. 24, No. 12, Jun. 15, 1974, pp. 603-605.

Primary Examiner—William L. Sikes
Assistant Examiner—Georgia Y. Epps
Attorney, Agent, or Firm—Peter A. Businger

[57] ABSTRACT

A method of selective area epitaxial growth using a scanning ion beam is described.

8 Claims, 3 Drawing Sheets

DEVICES FABRICATED USING METHOD OF SELECTIVE AREA EPITAXIAL GROWTH USING ION BEAMS

This is a division of application Ser. No. 817,785, filed Jan. 8, 1986, now U.S. Pat. No. 4,622,093, which is a continuation of application Ser. No. 517,755 filed on July 27, 1983 and now abandoned.

TECHNICAL FIELD

This invention relates generally to methods of epitaxial growth and particularly to such methods that grow epitaxial structures on selected areas using ion beams and to the structures grown by such methods.

BACKGROUND OF THE INVENTION

Modern semiconductor technology depends upon methods for growing a multiplicity of high quality semiconductor layers on, for example, a substrate or other epitaxial layers. The layers should have few residual, i.e., undesired, impurities and carrier traps as well as few structural imperfections. Accordingly, several methods have been developed to grow such epitaxial layers. The layers may comprise elemental semiconductors, such as silicon or germanium, or compound semiconductors such as Group III-V or Group II-VI binary, ternary, or quaternary semiconductors.

For the growth of Group III-V compound semiconductor materials, the first method developed and brought to a high degree of perfection was liquid phase epitaxy (LPE). While this method is now well developed and perfectly adequate for the fabrication of many types of epitaxial layers and devices comprising at least one of such layers, it is not without its limitations. For example, LPE requires that a substrate be moved from one melt to another, etc., with epitaxial growth typically occurring in each melt. The melts are typically compositionally varying, and therefore, precautions generally have to be made to prevent undesired transport of melt constituents from one melt to another melt. While this limitation may be overcome by careful apparatus design and operation, other limitations appear more fundamental and difficult to overcome. For example, fabrication of ultra-thin layers, for example, less than 200 Angstroms thick, is usually difficult, if not impossible, with this technique. Even very thin, less than 1000 Angstroms thick, smooth layers have been difficult to grow reproducibly. Additionally, interfaces between layers having very abrupt, i.e., step function, compositional or doping variations are also difficult to fabricate.

As a result of these and other limitations, as well as for other reasons, additional techniques have been developed for the growth of Group III-V compound semiconductor materials. The most promising of these additional techniques at present appears to be molecular beam epitaxy (MBE). This method is described in detail in U.S. Pat. No. 3,615,931 issued to John R. Arthur, Jr. on Oct. 26, 1971. In MBE, effusion ovens containing the desired Group III and Group V materials are heated to a temperature sufficient to volatilize the materials and the resulting thermally evaporated beams are directed toward the substrate upon which epitaxial growth is desired. The substrate is maintained at a temperature that is high enough for surface diffusion and epitaxial growth to occur but is low enough so that the materials have a reasonable probability of sticking to the surface. The beams have a cosine square distribution in intensity and when the basic method is supplemented with other techniques, such as substrate rotation, permit growth of extremely compositionally uniform epitaxial layers over large diameter substrates. Furthermore, molecular beam epitaxy permits fabrication of, for example, extremely thin, in fact, even monolayer, epitaxial layers as well as interfaces having very abrupt compositional and doping variations.

The beams used by molecular beam epitaxy are generally electrically neutral. However, nonthermal charged particle, i.e., ion, beams have been used in at least several semiconductor epitaxial growth techniques. The use of nonthermal ions offers, at least theoretically, the possibility of lower substrate temperatures during growth because the kinetic energy of the deposited particles enhances surface diffusion. The preparation of InSb thin films by an ion beam epitaxy technique is described in *Journal of the Vacuum Society of Japan*, 20, pp. 241-246, July 1977. The technique described ionized both In and Sb particles. The ions were accelerated by a high constant voltage, 1000 volts or greater, applied to the substrate. Uniform area growth, within unspecified tolerances, was apparently demonstrated. However, for purposes of compositional control, flash evaporation was employed, i.e., the composition of the layer deposited was controlled by flash evaporation to completion of preweighed In and Sb charges. The preweighing was required because both the In and Sb particles were charged and thus had high sticking coefficients on the substrate surface. Consequently, the deposited layer might not have perfect stoichiometry as either In or Sb might be incorporated into the layer in excess.

Epitaxial growth of silicon on either germanium, Ge(100), or silicon, Si(100) or Si(111), substrates using ion beam epitaxy is described in *Applied Physics Letters*, 41, pp. 167-169, July 15, 1982. The method described used silicon ions having energies between 50 and 100 eV and obtained epitaxial silicon growth at substrate temperatures between 300 and 900 degrees K. The silicon beam was formed by thermal evaporation of silicon from an effusion oven, and a discharge voltage of 60 volts accelerated the particles from the plasma. Growth of thin and high-quality silicon layers was reported. However, this method permits the growth only of elemental semiconductors.

As is evident from the preceding discussion, molecular beam epitaxy is not generally a selective area growth technique because the molecular beams impinge upon the entire crystalline substrate, i.e., the beams cover the entire substrate surface. Techniques have been developed which modify the basic molecular beam epitaxy technique described by Arthur to permit selective area growth. However, these techniques require steps, for example, suitable substrate preparation, which necessitate additional processing complexity. See, for example, U.S. Pat. No. 3,982,092 issued on Dec. 23, 1975 to William Charles Ballamy and Alfred Yi Cho. The method described by Ballamy and Cho prepares planar isolated devices by forming an amorphous insulating layer on a Group III-V substrate and removing selected portions of the layer to expose the underlying crystalline material thus yielding a patterned substrate. These steps are performed outside the MBE growth chamber. The now patterned substrate is transported into the MBE growth chamber for deposition of material by MBE. Single crystal material grows only on the exposed portions of the substrate. Other selective area growth techniques, for example, mechanical shadow masking, are known.

Ion beams have been used for other purposes in epitaxial growth processes. For example, *Applied Physics Letters*, 40, pp. 686-688, Apr. 15, 1982, describes the use of a high energy ion beam in silicon fabrication. Amorphous silicon is initially deposited. A high energy, approximately 2.5 MeV, arsenic ion beam is then directed to the amorphous silicon layer. The resulting heating causes the recrystallization of the amorphous silicon with the impurity arsenic atoms from the ion beam located on substitutional sites within the crystal lattice.

SUMMARY OF THE INVENTION

Selective area epitaxial growth may be obtained using ion beam epitaxy by scanning a first beam comprising Group III particles over selected areas of a larger area and flooding said larger area with a second thermal beam comprising Group V particles. The first beam comprises particles which are ionized for a portion of the transit time between source and substrate during which the beam may be deflected to the desired substrate areas. The second beam may be neutral as produced by conventional thermal evaporation or it may be ionized. The growth rate is determined by the concentration of Group III particles on the substrate surface and selective area growth thus results. The Group III particle beam may comprise aluminum, gallium or indium particles and the Group V beam may comprise Group V particles such as arsenic, phosphorus, or antimony. If desired, the first beam comprising Group III particles may be neutralized after the particles attain the desired energy and the beam has been scanned to the desired direction. In another embodiment, the substrate is flooded with a second Group III particle beam and molecular and ion beam epitaxy occur simultaneously on different substrate areas. In yet another embodiment, a plurality of ion beams strikes the substrate simultaneously at either the same or different substrate areas. Additionally, ion beam epitaxy according to this invention may be used to grow compound materials in which one or more of the constituent elements have a significantly lower sticking coefficient at the growth temperature than do the other constituent elements.

For reasons of clarity, the elements in the FIGURES are not drawn to scale.

DETAILED DESCRIPTION

Figure 1:
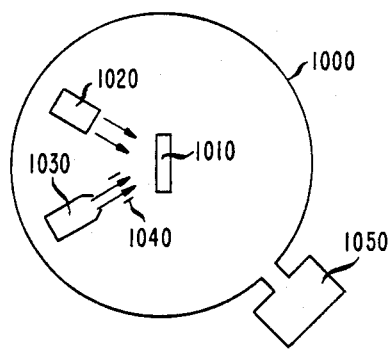
FIG. 1 is a schematic representation of apparatus suitable for the practice of this invention.

Apparatus suitable for the practice of this invention is schematically shown in FIG. 1. The apparatus comprises at least one ion beam source for a Group III element, indicated as 1030, means for scanning 1040 the ion beam from source 1030, and at least one effusion oven for a Group V element, indicated as 1020. Source 1030 further comprises means for accelerating the particles, for example, an accelerating gun. These elements are enclosed in chamber 1000 which may be evacuated by pump 1050 to a high vacuum, i.e., a vacuum of at least $10^{-6}$ Torr and preferably to at least $10^{-9}$ Torr. The particle beams from the oven and the ion source are indicated schematically by the arrows and are directed to substrate 1010 which is located within chamber 1000.

The ion beam source and the means for scanning the ion beam that are used are well known to those skilled in the art and can be similar to those described in, for example, *Applied Physics Letters*, 34, pp. 310-312, 1979. The ion beam source is charged with a Group III element. The means for scanning, i.e., deflecting, permits the beam to be scanned to any point on the substrate, that is, it may be deflected to any point on the two-dimensional substrate surface. The points collectively form a selected area within a larger area, e.g., a substrate. The means for deflecting may be, for example, any conventional electrostatic or electromagnetic deflection means. Such means are known to those skilled in the art and need not be described in detail. It will readily be appreciated by those skilled in the art that the ion beam may be focused. Additionally, if desired, the ion beam may be neutralized after it leaves the accelerating gun and the means for scanning has deflected it to the desired direction.

The at least one effusion oven for the Group V element is a conventional effusion oven with means for resistive heating of the oven to evaporative temperatures. More than one effusion oven may be used for Group V elements. The effusion ovens for the Group V elements are charged with the Group V elements and the thermal beams from these ovens flood the substrate. The term "flood" means that the beam strikes the entire substrate or a substantial portion of the substrate. Another effusion oven may be charged with a Group III element if molecular and ion beam epitaxy are to occur simultaneously. The Group V elements may also be charged if it is desired to improve its sticking coefficient during growth.

Important ion beam parameters include the following: current, beam size, beam energy, scanning rate. In general, the beam current should be as large as possible as this parameter essentially determines the rate of epitaxial growth and higher currents permit faster growth. Typical beam currents are within the range from 5 $\mu$amp to approximately 150 $\mu$amp. The size of the features, which are essentially one-dimensional figures, i.e., lines, being written is determined by the ion beam size. Typical ion beam diameters at the substrate surface are approximately several microns for ion beam epitaxy at low ion beam energies. Smaller diameters may be obtained at low ion beam energies but with smaller currents. At higher energies, smaller beam diameters, for example, less than 1 $\mu$m, are easily attained. The features may be formed either by a single scan or by repetitive scans. The beam energy will be typically between approximately 10 eV and approximately 35 KeV per beam particle. Energies greater than 2 KeV may result in the removal of some of the underlying material. The upper limit is determined by the desire to have the beam particles cause little damage to the substrate. The lower limit is determined by the operational stability of the ion source. Within this range, higher accelerating voltages, however, permit smaller features to be written as the beam can be more easily focused to a small size. The scanning rate, for a given beam current and beam size, will be determined by the desired thickness in the growth direction of the ion beam initiated epitaxial growth as slower scanning rates will yield layers of greater thickness in the growth direction than will faster scanning rates. Another important growth parameter is the substrate temperature. As will be readily appreciated, the energy of the particles in the ion beam will contribute to the substrate heating and also enhance surface diffusion. Consequently, the substrate generally need not be heated to temperatures as high as those normally used in MBE.

The ovens for both the ordinary effusion cells and the ion source are charged with the desired Group III and Group V elements and placed in the growth chamber with the substrate. The substrate comprises a Group III-V compound semiconductor having a lattice constant so that it is at least approximately lattice matched to the desired epitaxial layers. The chamber is evacuated, after appropriate substrate cleaning using well-known techniques, to a pressure of approximately $10^{-9}$ Torr and the ovens and substrate heated to their desired temperatures. The temperatures of the thermal effusion ovens are determined, in well-known manner, by the need to obtain desired flux levels of the Group III and Group V elements at the substrate surface. Within the ion beam source that contains the Group III element, the oven is heated to a temperature sufficient to insure that the charge is molten. The particle flux intensity from the ion source is then controlled by the size of the extracting voltage and the accelerating voltage. The beam of Group III particles is scanned, as desired, over the substrate surface while the beam of Group V particles simultaneously floods the surface. The density of Group III particles at the surface controls the rate of ion beam initiated epitaxial growth.

Other embodiments are contemplated. For example, a thermal beam comprising Group III particles may also flood the substrate. Molecular beam and ion beam epitaxy then proceed simultaneously. If the molecular and ion beam comprise the same Group III element, two constituent, i.e., binary, material is grown and if they comprise different elements, three constituent, i.e., ternary, material is grown in those areas they both strike and binary material is grown in those areas that only the molecular beam strikes. It will be readily appreciated that more than one molecular or ion beam may be used thus allowing selective area growth of binary, ternary, and quaternary materials to proceed simultaneously. For example, two or more thermal beams of Group V particles may be used.

Several desirable attributes of ion beam epitaxy according to this invention are now apparent. In particular, it will be readily appreciated by those skilled in the art that the highly directional ion beam may be incident on arbitrarily selected substrate areas by appropriately defocusing and/or focusing the beam to obtain the desired beam size and then electrostatically or electromagnetically deflecting the beam to produce the desired pattern.

The growth rate is precisely controlled by both the beam scanning rate and the beam current. By varying these parameters during the ion beam initiated process, the thicknesses of the features in both the growth and lateral directions, as well as the chemical compositions of the epitaxial lines, may be controlled in a very precise manner.

The ion beam, because it is charged, may be abruptly turned on and off by electrostatic or electromagnetic means instead of the mechanical shutters that are conventionally used in molecular beam epitaxy. This permits very abrupt compositional changes to be made.

Figure 2:
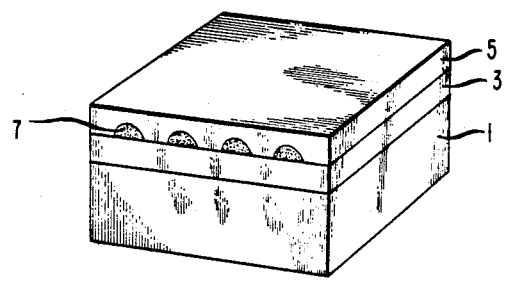
FIGS. 2-8 show exemplary devices expediently fabricated according to this invention.

Several exemplary structures grown with the method of this invention are shown in FIGS. 2-8. FIG. 2 depicts a buried heterostructure laser comprising a substrate 1, a first epitaxial layer 3 having a first conductivity type, a second epitaxial layer 5 having a second conductivity type, and a plurality 7 of active stripes. In one embodiment, the device comprises an $n^+$-type GaAs substrate, an n-type $Al_xGa_{1-x}As$ first layer 3, a p-type $Al_xGa_{1-x}As$ second layer 5, and GaAs active stripes 7. The $Al_xGa_{1-x}As$ layers 3 and 5 are grown by conventional MBE techniques. The active stripes 7 are grown by ion beam epitaxy after layer 3 has been grown. These stripes are grown by raster scanning the Ga beam to form the array of GaAs stripes.

Figure 3:
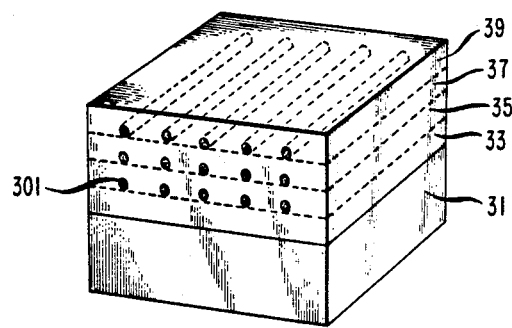

FIG. 3 depicts a structure comprising one-dimensional conducting channels for electronic devices. The term "one dimensional" means that the dimensions, in two directions, of the features formed are sufficiently small that the carrier energy levels are quantized. The structure comprises a substrate 31, a plurality of epitaxial layers 33, 35, 37, and 39 having a first conductivity type, and a plurality of one-dimensional tubes 301. The one-dimensional channels, that is, tubes, are grown by ion beam epitaxy and the layers enclosing the channels are grown by MBE as described above. The channels may be highly conducting. The one-dimensional arrays of highly conducting channels, gases in the tubes, are formed as the carriers, that is, electrons or holes, move into the undoped high purity semiconductor tubes from the surrounding n-type or p-type semiconductor layers. As will be appreciated by those skilled in the art, layers 33, 35, 37, and 39 may be either n-type or p-type and the tubes will thus contain one-dimensional electron or hole gases within the same matrix.

Figure 4:
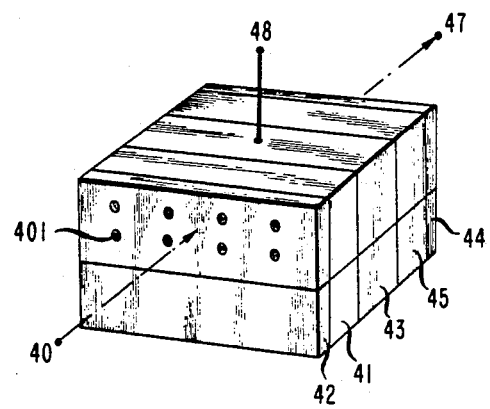

FIG. 4 shows a high mobility field effect transistor which uses the one-dimensional gases. The device has source, drain, and gate electrodes indicated as 40, 47, and 48, respectively. Regions 41 and 45 are semi-insulating semiconductors while regions 42, 43, and 44 comprise metals for the source, gate, and drain region, respectively. The one-dimensional electron or hole gas tubes indicated as 401 provide high mobility conduction channels between the source and drain region.

Figure 5:
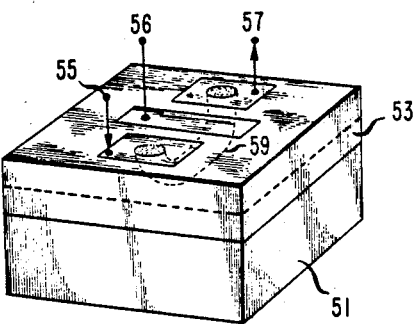

The one-dimensional tubes need not be planar. Another field effect transistor having a one-dimensional channel is depicted in FIG. 5. The transistor comprises substrate 51; first epitaxial layer 53 having a first conductivity type; source, gate, and drain electrodes 55, 56, and 57, respectively. The source and drain regions are connected by the undoped one-dimensional tube 59.

Figure 6:
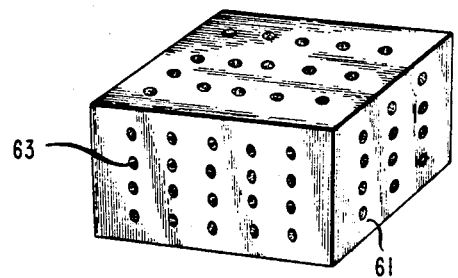

FIG. 6 depicts a structure comprising a body 61 and a three-dimensional array of electron or hole gas pockets 63. The pockets form a three-dimensional structure having a periodicity that is easily varied. The pockets are formed by modifying the growth technique used for the one-dimensional tubes so that the ion beam strikes the substrate periodically for a time sufficient to form the desired pockets.

Figure 7:
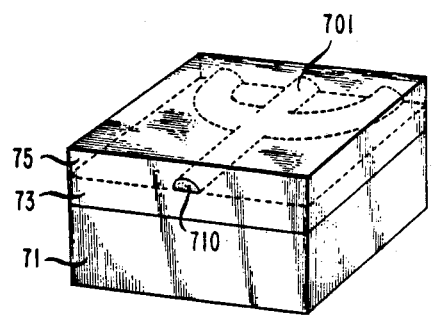

Ion beam epitaxy is also useful in growing integrated optics devices. For example, FIG. 7 shows a laser structure having multiple active areas feeding a single waveguide that may be fabricated expediently with ion beam epitaxy. The structure comprises substrate 71, first epitaxial layer 73 having a first conductivity type, second epitaxial layer 75 having a second conductivity type; and, at the interface of layers 73 and 75, a plurality of active stripes 701 which are optically coupled to waveguide 710. The active stripes are grown by ion beam epitaxy which proceeds simultaneously with the molecular beam epitaxy. Because both the ion beam epitaxy and molecular beam epitaxy are carried on simultaneously, the composition of the waveguide section may vary from that of the active stripes if the growth rate of the ion beam epitaxy during the growth of the waveguide section differs from that of the active stripes.

Figure 8:
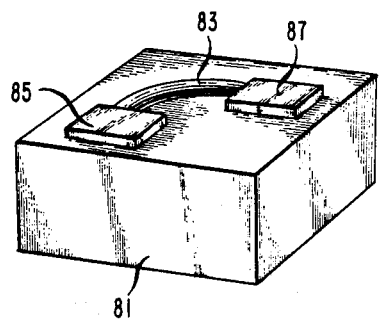

FIG. 8 illustrates yet another application of ion beam epitaxy according to this invention to the fabrication of integrated optics devices. The structure comprises substrate 81, waveguide 83, and devices 85 and 87. Curved waveguide 83 optically couples devices 85 and 87. As is shown, waveguides having essentially arbitrary configurations may be fabricated for the purpose of optically connecting various optical components.

If the ion beam is accelerated to a coefficiently high energy, removal of material may occur. If the ion beam is now scanned while MBE occurs, different growth rates, and perhaps compositions, will occur in the areas scanned and not scanned by the ion beam. Additionally, the scanning and flooding steps may occur sequentially rather than simultaneously.

As will be readily appreciated, other materials systems can also be used. They can be, for example, other Group III–V compound semiconductors, metals, semimetals, or superconductors. Additionally, all of the devices described as having one-dimensional channels, may be formed with larger dimensions if it is not desired that the carrier energy level be quantized with low quantum numbers. Devices other than those described may also be fabricated. For example, one-dimensional quantum well lasers may be fabricated.

What is claimed is:

1. A device comprising a structure which is epitaxially grown on a substrate and which comprises localized Group-III–V material, said material being grown by exposing a surface to a localized beam of ionized Group-III particles while said surface is flooded with a thermal beam of Group-V particles, whereby at least a portion of said material is rounded as viewed in the direction of said localized beam.

2. The device of claim 1 in which said material forms active stripes of a buried-heterostructure laser.

3. The device of claim 1 in which said material forms a one-dimensional conducting channel.

4. The device of claim 3 in which said channel provides for high-mobility conduction between a source region and a drain region.

5. The device of claim 3 in which said channel is non-planar.

6. The device of claim 1 in which said material forms a plurality of electron-or-hole gas pockets.

7. The device of claim 1 in which said material forms multiple laser-active areas feeding into a waveguide.

8. The device of claim 1 in which said material forms a waveguide.

* * * * *